United States Patent
Ravanelli et al.

Patent Number: 5,959,332
Date of Patent: *Sep. 28, 1999

[54] ELECTROSTATIC-DISCHARGE PROTECTION DEVICE AND METHOD FOR MAKING THE SAME

[75] Inventors: Enrico Ravanelli; Lucia Zullino, both of Milan, Italy

[73] Assignee: STMicroelectronics, S.r.l., Agrate Brianza, Italy

[*] Notice: This patent issued on a continued prosecution application filed under 37 CFR 1.53(d), and is subject to the twenty year patent term provisions of 35 U.S.C. 154(a)(2).

[21] Appl. No.: 08/510,716

[22] Filed: Aug. 3, 1995

[51] Int. Cl.$^6$ ...................................................... H01L 23/62
[52] U.S. Cl. ........................ 257/360; 257/133; 257/362; 257/363
[58] Field of Search ...................................... 257/358, 360, 257/362, 363, 133, 173, 355, 356, 357

[56] References Cited

U.S. PATENT DOCUMENTS

| | | | |
|---|---|---|---|
| 4,400,711 | 8/1983 | Avery | 257/360 |
| 5,182,220 | 1/1993 | Ker et al. | 437/34 |
| 5,225,702 | 7/1993 | Chatterjee | 257/360 |
| 5,272,097 | 12/1993 | Shiota | 257/356 |
| 5,455,436 | 10/1995 | Cheng | 257/362 |

FOREIGN PATENT DOCUMENTS 2 268 007  12/1993  United Kingdom.

OTHER PUBLICATIONS

Chatterjee, A. et al., "A Low-Voltage Triggering SCR for On-Chip ESD Protection at Output and Input Pads", *EEE Electron Device Letters* 12:1, 21–22 (1991).

*Primary Examiner*—J. Carroll
*Attorney, Agent, or Firm*—David V. Carlson; Thomas L. Ewing; SEED and BERRY LLP

[57] ABSTRACT

The device has an SCR structure in a P surface zone of a silicon die. A P+ anode region for connection to an I/O terminal to be protected is formed in an N region, as well as an N+ contact region; an N+ cathode region is formed in another N region for connection to the earth of the integrated circuit. The striking potential of the SCR, that is, the intervention potential of the protection device, is determined by the reverse breakdown of the junction between the first N region and the P-body surface zone. This potential is influenced by an electrode which is disposed over the junction and is connected to the cathode constituting the gate of a cut-off N-channel MOS transistor. The concentrations are selected in a manner such that the P-channel MOS transistor defined by the P region, by the portion of the first region over which the electrode is disposed, and by the P-body, has a conduction threshold greater than the striking potential. The device can be integrated in a very small area and is very efficient in terms of both energy and response speed.

21 Claims, 1 Drawing Sheet

ELECTROSTATIC-DISCHARGE PROTECTION DEVICE AND METHOD FOR MAKING THE SAME

TECHNICAL FIELD

The present invention relates to MOS integrated circuits and, more particularly, to a device for protection against electrostatic discharges on the I/O terminals, that is, the input and output terminals of integrated circuits of this type.

BACKGROUND OF THE INVENTION

Many input terminals of a MOS integrated circuit are connected to the gate electrodes of respective input MOS field-effect transistors and many output terminals of the integrated circuit are connected to the drain regions of respective output MOS field-effect transistors.

It is known that the terminals of an integrated circuit are subject to accidental contacts with electrically-charged bodies, both during their manufacture and during assembly in a circuit unit or in operation, so that potential differences, possibly of very considerable magnitude, may be created between the gate electrodes of the input transistors, or the drain regions of the output transistors, and the substrate of semiconductor material on which the integrated circuit is formed. In the first case, as soon as the potential difference exceeds the dielectric strength threshold of the gate insulation, the transistor is destroyed by the electrostatic discharge, which develops through the insulation and, in the second case, a similar destructive effect occurs as soon as the potential difference exceeds the reverse breakdown threshold of the drain junction. By way of example, in a CMOS integrated circuit manufactured with 1.2 μm technology (that is, with minimum gate dimensions of 1.2 μm), the destructive-breakdown potential is 12–14 V for the input transistors and about 12 V for the output transistors.

Various devices are known for protecting the input and output terminals from electrostatic discharges. Some of these use resistors in series and diodes which are in series and/or in parallel and are integrated in the substrate on which the integrated circuit is formed, in order to limit or shunt the currents due to the electrostatic discharges, and are suitable essentially for protecting input terminals; others use thyristor or SCR (silicon-controlled rectifier) structures in parallel and may be used for protecting both input and output terminals. An SCR structure is very advantageous since it has a very low resistance when it is conducting and is very efficient in energy terms since the heat produced during conduction is distributed in a relatively large volume. However, in many applications, the striking potential of the SCR is much higher than the destructive-breakdown potential of the input and output transistors. Modified SCR structures which provide measures for lowering the striking potential are therefore used.

For example, in a known device described in the article published on pages 21 and 22 of IEEE Electron Device Letters, Vol. 12, No. 1, January 1991, a MOS transistor biased for cut-off is associated with a lateral SCR and causes striking of the SCR by means of the charge generated by the reverse conduction through its drain junction. The striking potential value can be adjusted to a certain extent by modification of the geometry of the gate electrode, advantage being taken of the fact that the reverse conduction voltage decreases with the length of the gate.

This known structure functions satisfactorily only if the anode and cathode regions of the SCR are quite far apart and/or if adequate insulation is provided between these regions to prevent the formation of a parasitic P-channel MOS transistor, biased for conduction, in parallel with the SCR and having a conduction threshold below the striking threshold of the protection device. This involves the use of a relatively large area of the substrate.

SUMMARY OF THE INVENTION

An object of the present invention is to propose a device for protecting a MOS-type integrated circuit against electrostatic discharges on an input or output terminal, the device being incorporated in the integrated circuit, being able to be formed in an extremely small area, and nevertheless being very efficient in terms of both energy and response speed.

In accordance with one aspect of the invention, a discharge protection device is formed on a substrate. The device includes a surface zone of a first conductivity that is disposed on the substrate. A first region of a second conductivity is formed in the surface zone and has a first impurity concentration A second region of the first conductivity is formed in the first region. A third region of the second conductivity is formed in the surface zone and is separate from the first region. The third region has a second impurity concentration. An insulator is disposed on the first region, and a first electrically conductive material is disposed on a portion of the insulator that is contiguous with the first region.

BRIEF DESCRIPTION OF THE DRAWINGS

The invention will be explained further by the following detailed description of an embodiment thereof, which is given by way of example and is therefore in no way limiting, with reference to the appended drawings, in which.

DETAILED DESCRIPTION OF THE INVENTION

Figure 1:
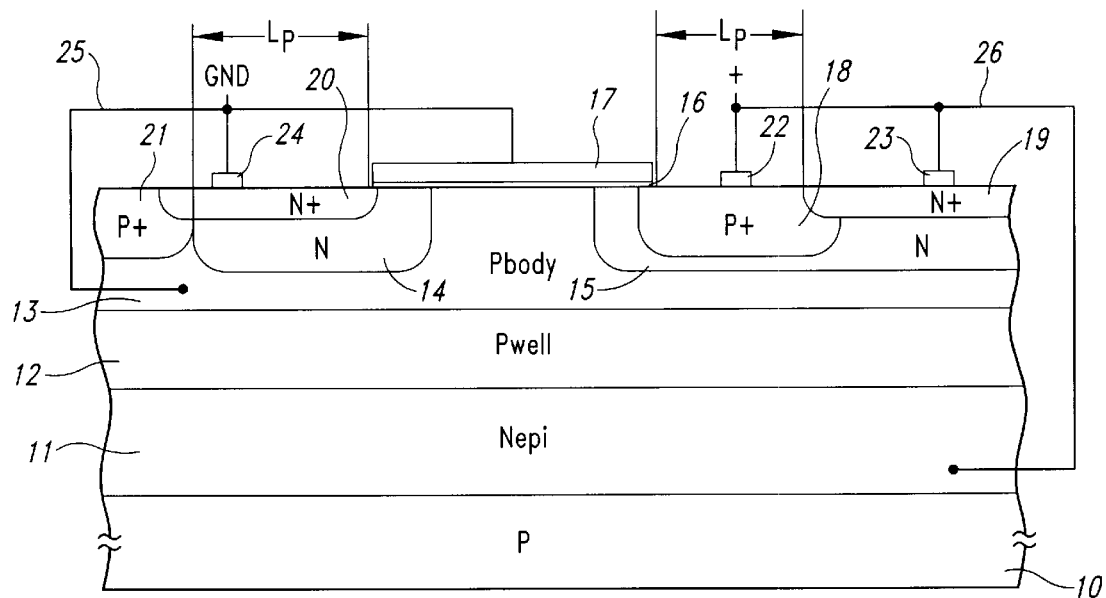
FIG. 1 is a partial section of a die of semiconductor material, which shows the structure of a device according to the invention.

The structure shown is formed within a process for the production of a complex integrated circuit comprising, among other things, pairs of complementary MOS (CMOS) transistors. The input terminals to be protected are connected to the gate electrodes of the CMOS transistors and the output terminals to be protected are connected to the drain regions of the N-channel transistors of the CMOS pairs.

The structure is formed on a monocrystalline silicon die constituted by a P-type substrate 10 on which an N-type epitaxial layer 11 having a thickness of 8–10 μm and a resistivity of about 1.5 ohms×cm extends. A P-type surface zone, formed by two regions indicated 12 and 13, is formed in the epitaxial layer 11. The region 12 (the "P-well") is produced, in this case, by the implantation of boron with an implantation dose of between $8\times10^{12}$ cm$^{-2}$ and $1.2\times10^{13}$ cm$^{-2}$ to produce a junction depth of about 3.5 μm. The region 13 (the "P-body") is formed in the "P-well" region 12 with a greater concentration of impurity, in this embodiment, by the implantation of boron with a dose of between $1\times10^{13}$ cm$^{-2}$ and $3\times10^{13}$ cm$^{-2}$ to reach a depth of 1.25 μm. Two N-type regions, indicated 14 and 15, which extend into the "Pbody" region 13 from the major frontal surface of the die, are formed by the implantation of arsenic with a dose of about $1\times10^{15}$ cm$^{-2}$, to reach a junction depth about 1 μm.

A structure constituted by a layer 16 of about 30 nm of silicon dioxide adjacent the surface of the silicon die, and by a superimposed layer 17 of doped polycrystalline silicon, which form, respectively, the dielectric and the gate electrode of an N-channel MOS transistor having the region 15 as its drain and the region 14 as its source, is formed after the formation of the regions 14 and 15. This gate structure acts as a mask during the subsequent implantation of two regions of which one is a P-type region and the other an N-type region, indicated 18 and 20 respectively.

In this embodiment, the region 18 is formed in the N-type-region 15 by the implantation of boron with a dose of about $2\times10^{15}$ $cm^{-2}$ to reach a junction depth of 0.4 μm. An N-type region 19 laterally adjacent the P-type region 18 and having an impurity concentration greater than that of the region 15 is produced by the implantation of arsenic with a dose of about $5\times10^{15}$ $cm^{-2}$ to reach a depth of 0.25 μm. The region 20, which is similar or identical to the region 19, is formed in the N-type region 14 by the same implantation step. A P-type region 21, which is adjacent the N-type region 20 as shown in the drawings, is also formed in the "P-body" region 13, preferably in the same implantation step as the region 18.

Three elements 22, 23 and 24 of electrically-conductive material, for example, aluminum, are formed on the surfaces of the regions 18, 19 and 20, respectively, in ohmic contact therewith. The first two constitute the anode terminal, indicated+and the third constitutes the cathode terminal, indicated GND, of the device.

Suitable connection means, which are shown simply as conductor wires 25 and 26 in the drawing but which are constituted partly by diffused N-type and P-type regions and partly by tracks of electrically-conductive material, for example, aluminum or doped polycrystalline silicon, which extend on the surface of the silicon die, and are insulated electrically therefrom except at the points of ohmic contact with the silicon surface, electrically interconnect, on the one hand, the "P-body" region 13, the contact element 24 on the region 20 and the gate electrode 17 and, on the other hand, the epitaxial layer 11 and the contact elements 22 and 23 on the regions 18 and 19. The two terminals GND and+of the protection device are connected to the earth terminal, i.e., ground pin, of the integrated circuit and to an input or output terminal to be protected, respectively, by means of connecting elements, not shown.

Figure 2:
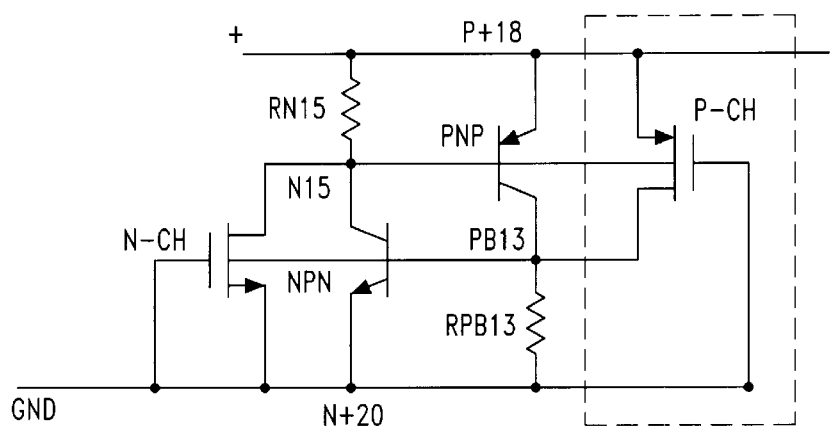
FIG. 2 is a circuit diagram equivalent to the structure of FIG. 1.

For an understanding of the operation of the device shown in FIG. 1, the equivalent circuit diagram shown in FIG. 2 will be considered.

The SCR structure is represented as usual by two bipolar transistors, one of the PNP type and the other of the NPN type; the base and collector terminals of the PNP transistor are connected, respectively, to the collector and base terminals of the NPN transistor. The emitter of the PNP transistor and the emitter of the NPN transistor constitute the anode and the cathode of the SCR structure, respectively.

In FIG. 2, the two bipolar transistors are indicated PNP and NPN and the various points of the circuit diagram are indicated by reference symbols and numerals which refer to those of FIG. 1. In particular, the emitter, base and collector terminals of the PNP transistor are connected to points indicated P+18, N15 and PB13, respectively, to indicate that this transistor is formed by the strongly-doped P-type region 18, the N-type region 15, and the "P-body" region 13, respectively and the emitter, base and collector terminals of the NPN transistor are connected to points indicated N+20, PB13 and N15, respectively, to indicate that this transistor is formed by the strongly-doped N-type region 20, the "P-body" region 13, and the N-type region 15, respectively. A resistor RN15 inserted between the base and the emitter of the PNP transistor in the diagram of FIG. 2 represents the distributed resistance of the base region 15 which is contacted and connected to the emitter terminal, that is, to the anode of the SCR structure, by means of the region N+19, by the connection element 23 which is in ohmic surface contact, and by the conductor wire 26. Similarly, a resistor RPB13 inserted between the base and the emitter of the NPN transistor represents the distributed resistance of the "P-body" base region 13 which is connected, in the manner described above, to the emitter terminal which is the cathode of the SCR structure. It should be noted that the SCR structure does not have an externally-accessible gate electrode. Instead, it has two control electrodes which correspond to the base terminals of the two bipolar transistors which are biased by the voltages which develop across the resistors RN15 and RPB13.

The structure of FIG. 1 also has two MOS field-effect transistors, an N-channel transistor and a P-channel transistor, indicated N-CH and P-CH, respectively, in the diagram of FIG. 2. The transistor N-CH has the N-type regions 14 and 20 as its source, the N-type region 15 as its drain, and the layer 17 of polycrystalline silicon as its gate. The transistor P-CH has the region 18 as its source, the "P-body" region 13 as its drain, and the polycrystalline silicon layer 17 again as its gate.

When the device described above is connected between the earth terminal and an input or output terminal of the integrated circuit, any positive voltage at the anode+relative to the cathode GND of the structure biases the emitter-base junctions of both the transistors directly, and the junction between the regions 13 and 15, which constitutes the base-collector junction of both the transistors, in reverse. The striking potential of the SCR structure corresponds to the reverse breakdown potential of this junction. If the polycrystalline silicon layer 17 were not there, this would be brought about essentially by the doping concentrations of the two regions alone. However, the presence of the layer 17 connected to the earth terminal brings about a change in the distribution of the electric field in the region of curvature of the junction, tending to reduce its destructive-breakdown potential. The manufacturing parameters, particularly the concentrations of the regions 13 and 15, are selected as described above so as to obtain the desired breakdown potential to protect the input and output terminals of the integrated circuit; in the embodiment described, this potential is about 11 V.

It should be noted that, in the embodiment shown, the junction between the regions 13 and 15 is also the drain junction of the transistor N-CH. This transistor is biased for cut-off, since its gate electrode is connected to the source electrode. Moreover, it is formed by the same process steps as the N-channel transistors of the CMOS pairs, and thus also as the output transistors, that is, those of which the drains are connected to the output terminals to be protected. The inevitable variations of the process parameters therefore affect the characteristics of the structure to be protected and those of the protection structure in the same manner. That is, in practice, the protection device is adapted automatically, since a reduction or an increase in the reverse breakdown potential of the drain junctions of the N-channel MOS output transistors coincides with a corresponding reduction or a corresponding increase in the striking potential of the SCR structure of the respective protection devices.

As already mentioned, the structure of FIG. 2 also comprises a P-channel MOS transistor, indicated P-CH in FIG.

1. This transistor does not contribute to the operation of the protection device. It is thus an undesired parasitic component since, as a P-channel MOS transistor which is biased for conduction (since its gate is connected to a lower potential than the source potential) it could shunt the SCR structure if its threshold voltage were below the striking potential. According to the invention, conduction of the transistor P-CH is prevented by virtue of the fact that its "body" region, which is the N-type region 15, is relatively highly doped so that the surface inversion which would give rise to conduction could take place only at a potential greater than the striking potential of the SCR structure and, in practice, it does not therefore occur. In known structures such as that described in the IEEE article cited above, on the other hand, the aim was to have maximum spacing and/or the best possible insulation between the source and drain regions of the parasitic P-channel transistor, which took up a large area of the integrated circuit. By way of example, a protection device according to the prior art occupied an area 4–6 times larger than that of a device according to the invention.

Another advantageous aspect of the device according to the invention is constituted by the very rapid intervention of the protection device which characteristic is extremely important, particularly when input terminals are protected, since the excess voltages owing to electrostatic effect rise extremely quickly.

As is known, the turn-on time of the SCR structure is given by the square root of the product of the base charging times ("the base charging delays") of the two bipolar transistors which form the structure. The base charging delay, on the other hand, is a quadratic function of the base width. In the structure according to the invention, the base of the PNP transistor is defined by the difference between the junction depths of the N-type region 15 and of the P-type region 18. Since this difference is very small and may also be adjusted by modification of the junction depth of the region 15, the PNP transistor has a very short base charging delay; in the structure shown, in which the base width is 1 $\mu$m–0.4 $\mu$m=0.6 $\mu$m, a base charging delay of about 90 ps has been measured.

It is pointed out that, in the known structure described in the IEEE article mentioned above, the intervention speed of the protection device was considerably slower since the PNP transistor had a very wide base region.

The base of the NPN transistor is defined by the distance between the two N-type regions 14 and 15. This distance is limited by the need to prevent breakdown by "punch-through" (breakthrough) and, advantageously, is selected in a manner such that the breakdown potential of the drain junction of the transistor N-CH, that is, the junction between the region 15 and the "P-body" region, is equal to the "punch-through" voltage. In the structure according to the invention, this distance, which is easily adjustable independently of the length of the polycrystalline silicon layer 17, is about 1 $\mu$m and a base charging delay of about 80 ps has been measured. In summary, the intervention time of the protection device according to the invention is about 90 ps.

As far as the other process parameters are concerned, it should be noted that the level of doping of the "P-well" region 12 is selected in the manner described above such that the breakdown potential of the junction formed by this region with the adjacent epitaxial layer 11 is greater than the drain breakdown potential of the N-CH transistor, and the doping level of the "P-body" region 13 is selected in the manner described above such that the "punch-through" voltage of the PNP transistor is greater than the drain breakdown potential of the transistor N-CH.

It is also pointed out that the holding current of the SCR structure and the immunity to voltage peaks can easily be controlled by suitable dimensions of the distributed resistances RN15 and RP13, and this can be done, in practice, by adjusting the distances indicated LN and LP between the edges of the gate layer 17 and the regions P21 and N19, respectively.

Finally, it is important to point out that the device according to the invention, formed in a complex integrated circuit comprising CMOS transistors and EPROM memory cells, can be manufactured without any additional production steps but by making use of the steps of the standard process. Naturally, the invention can also advantageously be put into practice in integrated circuits in which, in order to produce their structure, it is necessary to use one or more special production steps which are not provided for by the standard process.

While the detailed description above has been expressed in terms of a specific example, those skilled in the art will appreciate that many other variations could be used to accomplish the purpose of the disclosed invention. Accordingly, it can be appreciated that various modifications of the above-described embodiments may be made without departing from the spirit and the scope of the invention. Therefore the spirit and the scope of the present invention is to be limited only by the following claims.

We claim:

1. A device for protection against electrostatic discharges on the input or output terminals of a MOS integrated circuit formed on a die of semiconductor material having a surface zone with a first type of conductivity, the device having an SCR structure comprising a first region with a second type of conductivity, extending into the surface zone from a major surface of the die, a second region with the first type of conductivity and having an edge portion, the second region extending into the first region from the same surface, a third region with the second type of conductivity, separate from the first region and extending into the surface zone from the surface, wherein the edge portion of the second region faces the third region, and first and second elements of electrically-conductive material in ohmic contact with the surfaces of the second and third regions, respectively, and constituting the terminals of the device, the first region forming, with the surface zone, a junction having a reverse breakdown potential which defines the striking potential of the SCR structure, the device further comprising a layer of electrically-conductive material which bridges over an edge portion of the first region in the surface zone, extends to the edge portion of the second region, and extends to the third region, and is electrically insulated therefrom, and which can be biased so as to modify the distribution of the electric field in the junction in a manner such as to reduce the reverse breakdown potential of the junction to a predetermined value.

2. A device according to claim 1 in which the layer of electrically-conductive material is the gate electrode of a MOS transistor.

3. A device according to claim 2 in which the SCR structure comprises a fourth region with the second type of conductivity, having an impurity concentration lower than that of the third region, extending into the surface zone from the major surface of the die, and comprising at least part of the third region, in which the MOS transistor has the first region as its drain region and the fourth region as its source region, and in which connection means are provided and electrically interconnect the surface zone, the gate electrode of the MOS transistor, and the second electrically-conductive element which is in ohmic contact with the third region.

4. A device according to claim 3 in which the SCR structure comprises a fifth region having the second type of conductivity, extending into the first region from the major surface of the die, and having an impurity concentration greater than that of the first region, and in which further connection means are provided and electrically interconnect the second region and the fifth region.

5. A discharge protection device formed on a substrate, said device comprising:
   a surface zone of a first conductivity disposed on said substrate and having a surface;
   a first region of a second conductivity formed in said surface zone and having a first impurity concentration;
   a second region of said first conductivity formed in said first region and having an edge portion;
   a third region of said second conductivity formed in said surface zone separate from said first region and having a second impurity concentration, wherein said edge portion of said second region faces said third region;
   an insulator disposed on said first region; and
   a first electrically conductive material disposed on said insulator, said first electrically conductive material bridging over a portion of said first region and bridging over the surface of the surface zone that is between said second and third regions, said first electrically conductive material extending to said edge portion of said second region and extending to said third region.

6. The protection device of claim 5 wherein said surface zone further comprises:
   a well layer disposed on said substrate and having a third impurity concentration; and
   a body layer disposed on said well layer and having a fourth impurity concentration.

7. The protection device of claim 6 wherein said fourth impurity concentration is greater than said third impurity concentration.

8. The protection device of claim 6 wherein said first and third regions are formed in said body layer.

9. The protection device of claim 5, further comprising a fourth region of said second conductivity formed in said surface zone and contiguous with a portion of said third region.

10. The protection device of claim 5, further comprising:
    a fourth region of said second conductivity formed in said surface zone and contiguous with a portion of said third region; and
    a second electrically conductive material that contacts said surface zone, said first material, and said third region.

11. The protection device of claim 5, further comprising a fourth region of said second conductivity type that is formed in said first region and has a third impurity concentration.

12. The protection device of claim 11 wherein said third impurity concentration is greater than said first impurity concentration.

13. The protection device of claim 11, further comprising said second and fourth regions being electrically shorted together.

14. The protection device of claim 5, further comprising an epitaxial layer of said second conductivity type disposed between said substrate and said surface zone.

15. A discharge protection device, comprising:
    an anode terminal;
    a cathode terminal;
    a first bipolar transistor having a first base, a first emitter directly connected to said cathode terminal, and a first collector;
    a second bipolar transistor having a second base directly connected to said first collector, a second emitter directly connected to said anode terminal, and a second collector directly connected to said first base; and
    a first field-effect transistor having a first source and a first gate directly connected to said cathode terminal and a first drain directly connected to said first collector.

16. The protection device of claim 15, further comprising:
    a first impedance coupled between said first collector and said anode terminal; and
    a second impedance coupled between said second collector and said cathode terminal.

17. The protection device of claim 15, further comprising a second field-effect transistor having a second source coupled to said anode terminal, a second gate coupled to said cathode terminal, and a second drain coupled to said second collector.

18. The protection device of claim 15 wherein:
    said first bipolar transistor comprises an npn transistor;
    said second bipolar transistor comprises a pnp transistor; and
    said first field-effect transistor comprises an n-channel transistor.

19. The protection device of claim 15, further comprising:
    a striking voltage;
    a second field-effect transistor having a second source coupled to said anode terminal, a second gate coupled to said cathode terminal, and a second drain coupled to said second collector, said second transistor having a threshold voltage that is greater than said striking voltage.

20. A discharge protection device, said device comprising:
    a layer of a first conductivity;
    a first region of a second conductivity formed in said layer and having a first impurity concentration;
    a second region of said first conductivity formed in said first region and having an edge portion;
    a third region of said second conductivity formed in said layer separate from said first region and having a second impurity concentration, wherein said edge portion of said second region faces said third region;
    an insulator disposed on said first region; and
    a first electrically conductive material disposed on said insulator, said first electrically conductive material bridging over a portion of said first region and bridging over the layer of the first conductivity that is between said second and third regions, said first electrically conductive material extending to said edge portion of said second region and extending to said third region.

21. The protection device of claim 5 wherein the first conductivity is P type and the second conductivity is N type.

* * * * *

UNITED STATES PATENT AND TRADEMARK OFFICE
CERTIFICATE OF CORRECTION

PATENT NO.      : 5,959,332
DATED           : September 28, 1999
INVENTOR(S)     : Enrico Ravanelli and Lucia Zullino It is certified that errors appear in the above identified patent and that said Letters Patent is hereby corrected as shown below:

The Foreign Application Priority Data was omitted.

On the cover page, please insert item
"[30]    Foreign Application Priority Data
Aug. 19, 1994  [EP]  European Pat. Off. ..........94830405.0"

Signed and Sealed this

Twenty-fourth Day of October, 2000

Attest:

Attesting Officer

Q. TODD DICKINSON
Director of Patents and Trademarks